United States Patent
Kim

(10) Patent No.: US 9,608,237 B2
(45) Date of Patent: Mar. 28, 2017

(54) FRAME ASSEMBLY FOR DONOR FILM AND METHOD OF MANUFACTURING ORGANIC LIGHT EMITTING DISPLAY APPARATUS USING THE SAME

(71) Applicant: Samsung Display Co., Ltd., Yongin (KR)

(72) Inventor: Dong Sul Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 401 days.

(21) Appl. No.: 14/078,662

(22) Filed: Nov. 13, 2013

(65) Prior Publication Data

US 2014/0370774 A1 Dec. 18, 2014

(30) Foreign Application Priority Data

Jun. 13, 2013 (KR) .................. 10-2013-0067901

(51) Int. Cl.
*B29C 65/00* (2006.01)
*H01L 51/00* (2006.01)
*H01L 51/56* (2006.01)

(52) U.S. Cl.
CPC .......... *H01L 51/56* (2013.01); *H01L 51/0013* (2013.01)

(58) Field of Classification Search
CPC ..... H01L 51/00; H01L 51/56; H01L 51/0013; B29C 33/00; B29C 33/20; B29C 65/00; B29C 65/02
See application file for complete search history.

(56) References Cited

U.S. PATENT DOCUMENTS

| | | | |
|---|---|---|---|
| 6,777,025 B2* | 8/2004 | Bedzyk | B41M 5/38207 156/230 |
| 2007/0049033 A1* | 3/2007 | Lee | C23C 14/042 438/692 |
| 2010/0311198 A1* | 12/2010 | Shin | H01L 51/0013 438/46 |

FOREIGN PATENT DOCUMENTS

KR 10-2006-0021215 3/2006
KR 10-2010-0130787 12/2010

* cited by examiner

*Primary Examiner* — Michael N Orlando
(74) *Attorney, Agent, or Firm* — H.C. Park & Associates, PLC

(57) ABSTRACT

A frame assembly for a donor film includes a main frame, an extension frame, and a clamping unit. The main frame extends in a first direction. The extension frame includes a cavity region configured to receive at least a portion of the main frame, the extension frame being coupled to at least one side of the main frame and moveable in the first direction relative to the main frame. The clamping unit is configured to detachably couple the donor film to the frame assembly, the extension frame being disposed between the at least one side of the main frame and the clamping unit.

11 Claims, 4 Drawing Sheets

FRAME ASSEMBLY FOR DONOR FILM AND METHOD OF MANUFACTURING ORGANIC LIGHT EMITTING DISPLAY APPARATUS USING THE SAME

CROSS-REFERENCE TO RELATED APPLICATION

This application claims priority from and the benefit of Korean Patent Application No. 10-2013-0067901, filed on Jun. 13, 2013, which is incorporated by reference for all purposes as if set forth herein.

BACKGROUND

Field

Exemplary embodiments relate to a frame assembly for a donor film and a method of manufacturing an organic light emitting display apparatus using the same, and, more particularly, to a frame assembly for a donor film, the frame assembly being configured to selectively stretch the donor film, and a method of manufacturing an organic light emitting display apparatus using the same.

Discussion

Conventional organic light emitting displays, which are one type of flat panel displays, typically include an anode electrode, a cathode electrode, and an intermediate layer including at least one organic emissive layer disposed between the anode electrode and the cathode electrode. It is noted that these organic light emitting displays usually exhibit wider viewing angles, better contrast ratios, and faster response time/speed than other conventional flat panel displays, such as light emitting diode displays. To this end, traditional organic light emitting displays may further include at least one organic film layer as a hole injection layer, a hole transport layer, an electron transport layer, and an electron injection layer, depending on whether the at least one emissive layer is formed of (or including) a polymer organic material or a low-molecular-weight material (LMWM).

To provide colors, conventional organic light emitting displays typically utilize a patterned organic film layer. As a patterning method, in the case of a LMWM organic light emitting display, use of a shadow mask may occur. In the case of a polymer organic material organic light emitting display, patterning may be achieved via, for example, inkjet printing, laser induced thermal imaging (LITI), and/or the like. The LITI method may be utilized to form minute patterns in an organic film layer, may be used for large surface area screens, and may provide for high resolution displays.

When forming an organic film layer using the LITI method, a light source, an organic light emitting display substrate (which is an acceptor substrate), and a donor film are typically utilized. The donor film is usually formed of a base film, a light-to-heat conversion (LTHC) layer, and a transfer layer. Light emitted from the light source is absorbed by the LTHC layer on the donor film and converted into thermal energy. In this manner, the converted thermal energy causes, at least in part, changes in adhesion forces among the LTHC layer, the transfer layer, and the acceptor substrate. The changes in adhesion forces may be leveraged to pattern the corresponding organic light emitting layer on the acceptor substrate.

Typically, a base film, on which an LTHC layer is formed, is fastened (or otherwise coupled) to a frame and is stretched. A thermal drying process and a process of forming a transfer layer formed of an organic material are performed. A donor film, on which the transfer layer is formed, is laminated on an acceptor substrate. To this end, the transfer layer on the donor film is transferred to the acceptor substrate via the LITI method. In association with the thermal drying process and the process of forming the transfer layer, heat is applied to the donor film in such a way that the donor film may droop or become wrinkled. As such, the wrinkled donor film may not be evenly laminated on the acceptor substrate, which may cause, at least in part, defects in an organic thin film transferred to the acceptor substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a frame assembly for a donor film, the frame assembly being configured to additionally stretch the donor film, and a method of manufacturing an organic light emitting display using the same.

Additional aspects will be set forth in the detailed description which follows and, in part, will be apparent from the disclosure, or may be learned by practice of the inventive concept.

According to exemplary embodiments, a frame assembly for a donor film includes a main frame, an extension frame, and a clamping unit. The main frame extends in a first direction. The extension frame includes a cavity region configured to receive at least a portion of the main frame, the extension frame being coupled to at least one side of the main frame and moveable in the first direction relative to the main frame. The clamping unit is configured to detachably couple the donor film to the frame assembly, the extension frame being disposed between the at least one side of the main frame and the clamping unit.

According to exemplary embodiments, a method of manufacturing a device using a donor film, includes: performing a first stretch of the donor film, the donor film being detachably coupled to an extendable frame assembly; applying heat to the first-stretched donor film; extending the extendable frame assembly to perform a second stretch of the heat-treated donor film; and disposing the heat-treated, second-stretched donor film on a substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept and, together with the description, serve to explain principles of the inventive concept.

DETAILED DESCRIPTION OF THE ILLUSTRATED EMBODIMENTS

Figure 1:
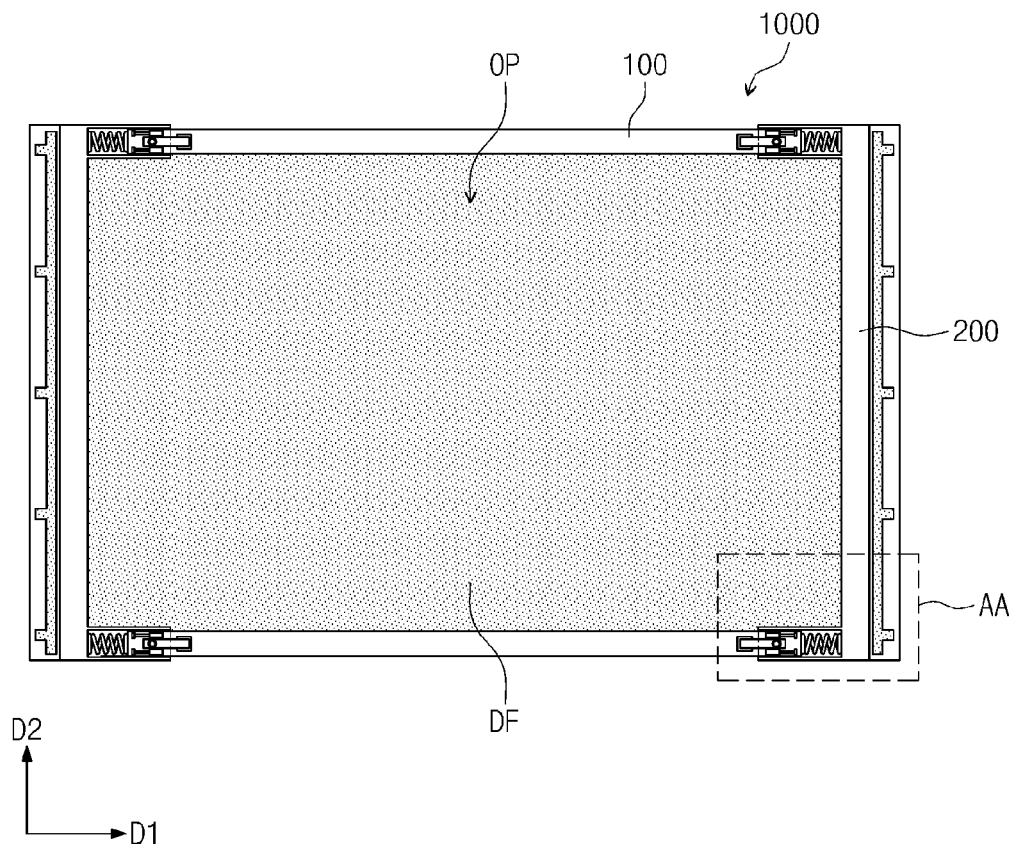
FIG. 1 is a plan view of a frame assembly for a donor film, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
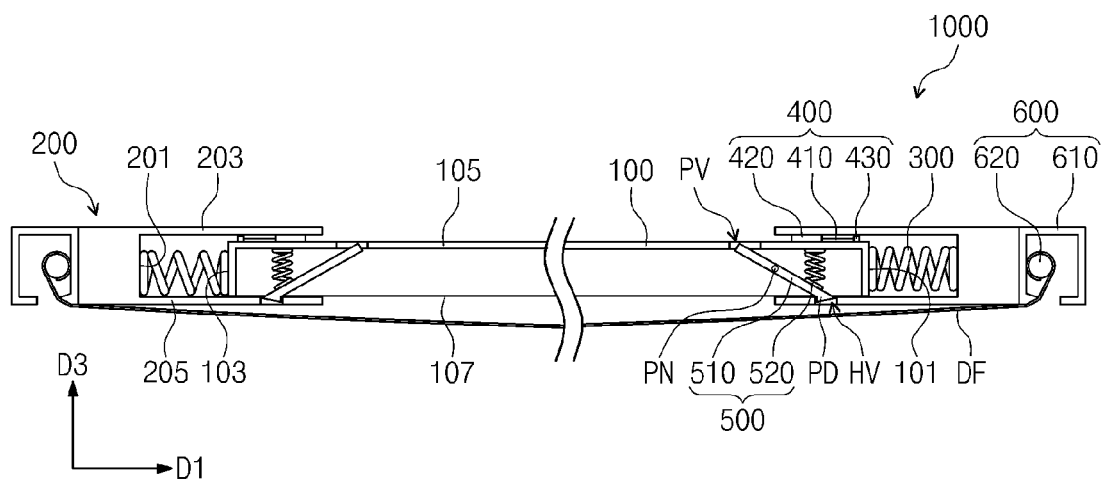
FIG. 2 is a side view of the frame assembly of FIG. 1, according to exemplary embodiments.

FIG. 1 is a plan view of a frame assembly 1000 for a donor film, according to exemplary embodiments. FIG. 2 is a side view of the frame assembly 1000, whereas FIG. 3 is an enlarged portion AA of the plan view of FIG. 1.

Figure 3:
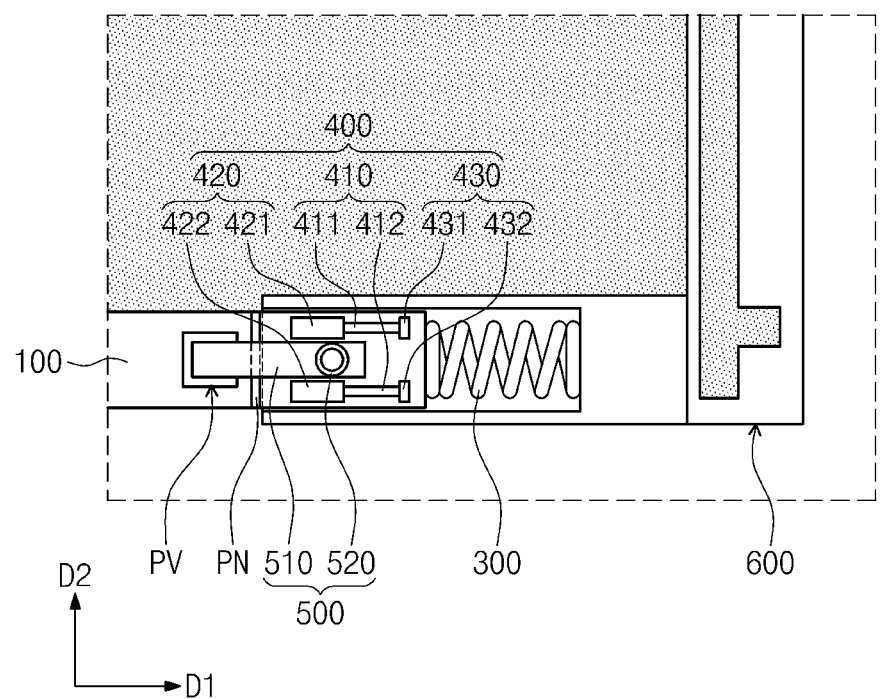
FIG. 3 is an enlarged portion AA of the plan view of FIG. 1, according to exemplary embodiments.

Referring to FIGS. 1 to 3, the frame assembly 1000 for the donor film includes a main frame 100, an extension frame 200, an extension spring 300, a linear coupling unit 400, a locking unit 500, and a clamping unit 600. Although specific reference will be made to this particular implementation, it is also contemplated that the frame assembly 1000 may embody many forms and include multiple and/or alternative components. For example, it is contemplated that the components of the frame assembly 1000 may be combined, located in separate structures, and/or separate locations.

According to exemplary embodiments, the frame assembly 1000 may have an approximate tetragonal ring shape with a thickness. As an example, the frame assembly 1000 may have a rectangular ring shape. It is contemplated, however, that any other suitable geometric configuration may be utilized. Hereinafter, a direction of longer sides of the frame assembly 1000 is designated as a first direction D1, a direction of shorter sides of the frame assembly 1000 is designated as a second direction D2, and a direction of a thickness of the frame assembly 1000 is designated as a third direction D3.

In exemplary embodiments, the main frame 100 forms the longer sides of the frame assembly 1000. The main frame 100 longitudinally extends in the first direction D1 and may be provided as two longitudinally extending components. For example, a first longitudinally extending component of the main frame 100 may be disposed at or near a first side of the frame assembly 1000 and a second longitudinally extending component of the main frame 100 may be disposed at or near a second side of the frame assembly 1000. The longitudinally extending components of the main frame 100 may be "tubular," e.g., may be configured with a hexagonal cross-sectional shape with a hollow interior region, such that a void space may be formed therein. Two faces of the main frame 100 separated from one another in the first direction D1 are designated as a side surface 101 and another side surface 103, respectively. In this manner, two other faces of the main frame 100 separated from one another in the third direction D3 are designated as a top surface 105 and a bottom surface 107.

The extension frame 200 forms the shorter sides of the frame assembly 1000, and may be coupled with the main frame 100 to maintain the shape of the frame assembly 1000. The extension frame 200 may be coupled with at least one side of the main frame 100, and may be movable (e.g., selectively translated or displaced) in the first direction D1. In exemplary embodiments, the extension frame 200 may include two longitudinally extending components coupled to the sides of the main frame 100. In this manner, the two longitudinally extending components of the extension frame 200 may be spaced apart from one another in the first direction D1. It is contemplated, however, that when the main frame 200 is provided as a rectangular ring shape excluding one shorter side, the extension frame 200 may be provided include only one longitudinally extending component.

Figure 4:
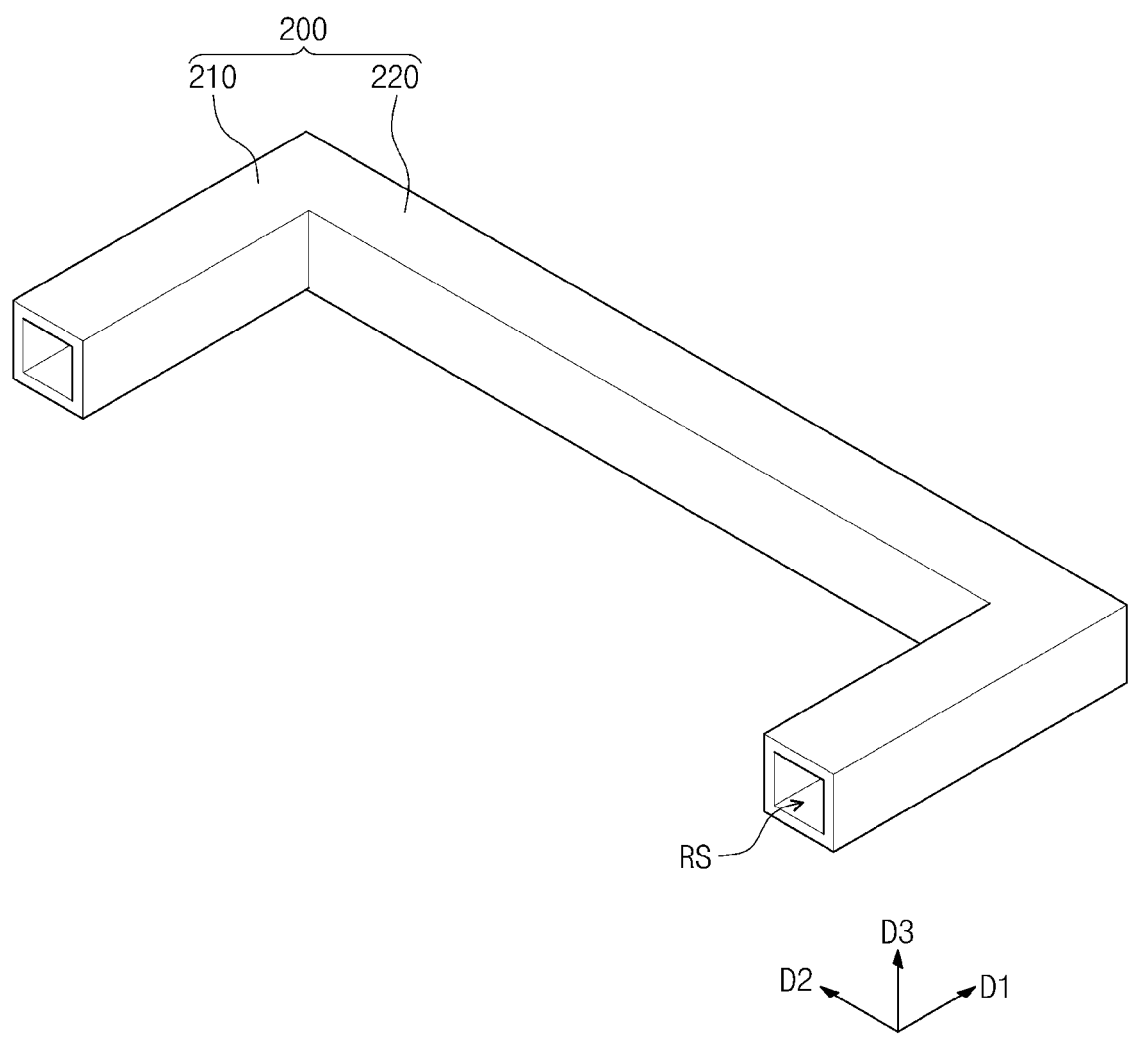
FIG. 4 is a perspective view of an extension frame, according to exemplary embodiments.

FIG. 4 is a perspective view of an extension frame 200, according to exemplary embodiments.

Referring to FIGS. 1 to 4, the extension frame 200 includes a coupling frame 210 and a connection frame 220.

The coupling frame 210 longitudinally extends in the first direction D1 and may be coupled with respective sides of the main frame 100 spaced apart from one another in the first direction D1. In this manner, the coupling frame 210 may be movable (or translatable) in the first direction D1. The coupling frame 210 has a void space, e.g., the coupling frame 210 has a "tubular" construction. In exemplary embodiments, the main frame 100 is inserted into the void space of the coupling frame 210, and, as such, a cross-section of the void space may be larger than a corresponding cross-sectional area of the side surface 101 and the other side surface 103, such as seen in FIG. 2.

The connection frame 220 longitudinally extends in the second direction D2 and connected to the coupling frames 210 adjacent to each other in the second direction D2. In hits manner, the connection frame 220 is configured to maintain a distance between two the coupling frames 210 adjacent to each other in the second direction D2. As such, the extension frame 200 including the coupling frames 210 and the connection frame 220 may have an approximate tetragonal ring shape excluding one side.

At a connection point of the coupling frames 210 and the connection frame 220, a containing groove RS, into which the main frame 100 is inserted, is formed. To this end, as the extension frame 200 is translated in the first direction D1, an insertion depth of the main frame 100 into the containing groove RS varies, as will be described later in more detail.

Referring to FIGS. 1 to 3, the extension spring 300 is disposed between the main frame 100 and the extension frame 200. That is, the extension spring 300 is disposed between the side surface 101 of the main frame 100 and an inner side surface 201 of the containing groove RS of the extension frame 200 that is disposed facing the side surface 101 of the main frame 100. Further, the extension spring 300 is disposed between the other side surface 103 of the main frame 100 and the inner side surface 201 of the containing groove RS of the extension frame 200 that faces the other side surface 103 of the main frame 100. To this end, the extension spring 300 may be compressed or stretched by an elastic force applied in the first direction D1, and, thereby, is configured to bias the extension frame 200 in the first direction D1. It is noted that since the extension springs are disposed inside the coupling frames 210, the number of the extension springs 300 may be the same as the number of the coupling frames 210. It is contemplated, however, that any suitable number and/or configuration of extension springs 300 may be utilized.

According to exemplary embodiments, the linear coupling unit 400 is configured to guide the translation of the extension frame 200 in the first direction D1. In this manner, the linear coupling unit 400 includes a linear motion (LM) guide 410, an LM block 420, and a stopper 430. The LM guide 410 may be disposed on the top surface 105 of the main frame 100, and may longitudinally extend in the first direction D1. The LM guide 410 may be a rail upon which the LM block 420 may translate. In exemplary embodiments, any suitable number of LM guides 410 may be utilized, however, as seen in FIG. 3, the LM guide 410 includes a first LM guide 411 and a second LM guide 412. The first LM guide 411 and the second LM guide 412 are separated from each other in the second direction D2.

The LM block 420 is coupled to a top wall of the containing groove RS, e.g., a top wall 203 of the coupling frame 210, and is mounted on the LM guide 410 to be movable. The LM block 420 may be translated along the LM guide 410 in the first direction D1, and, thereby, guides the transfer of the extension frame 200 in the first direction D1. The LM block 420 includes a first LM block 421 and a second LM block 422. The first LM block 421 is mounted on the first LM guide 411 to be movable, and the second LM block 422 is mounted on the second LM guide 412 to be movable.

According to exemplary embodiments, the stopper 430 is disposed on one end of the LM guide 410, e.g., an end of the LM guide 410 adjacent to the extension spring 300. The stopper 430 is configured to prevent separation of the LM block 420 from the LM guide 410. In this manner, the LM block 420 may be translated along the LM guide 410 in the first direction D1, however, the stopper 430 prevents the LM guide 410 from translating any further. As seen in FIG. 3, the stopper 430 includes a first stopper 431 and the second stopper 432. The first stopper 431 is disposed on one end of the first LM guide 411, and the second stopper 432 is disposed on one end of the second LM guide 412.

As seen in FIGS. 2 and 3, the locking unit 500, which is disposed inside the main frame 100, is configured to maintain a compressed state of the extension spring 300 or enable the extension spring 300 to enter a stretched state from the compressed state. To this end, the locking unit 500 includes a hook 510 and an inner spring 520. The hook 510 may have a bar shape with a protrusion PD on one end thereof. The hook 510 may be fastened to the main frame 100 via a fastening pin PN, which constricts movement of the hook in the first direction D1 and the second direction D2. The hook 510 may be rotated about the fastening pin PN with respect to the third direction D3.

A locking groove HV may be formed on a bottom wall 205 of the extension frame 200, and the hook 510 may be inclined to allow the protrusion PD to face and selectively engage the locking groove HV. To this end, the inner spring 520 may be disposed between the hook 510 and a top wall of the main frame 100. One end of the inner spring 520 is connected to a point between the fastening pin PN and the protrusion PD and longitudinally extends in the third direction D3, such that another end of the inner spring 520 is attached to the top wall of the main frame 100. In this manner, the inner spring 520 may provide an elastic force (e.g., a biasing force) to the protrusion PD of the hook 510, which may enable the protrusion PD of the hook 510 to be locked into (or otherwise engage) the locking groove HV. Also, a pushing groove PV may be formed on the top surface 105 of the main frame 100 to allow another end of the hook 510 to be exposed.

According to exemplary embodiments, the clamping unit 600 is disposed outside the extension frame 200. Multiple (e.g., two) clamping units 600 may be provided, and may be disposed on the outsides of the extension frames 200, respectively. The clamping unit 600 may be disposed opposite to the main frame 100 in the first direction D1. To this end, the extension frame 200 may be disposed between the clamping unit 600 and the main frame 100. The clamping unit 600 is configured to clamp (or otherwise detachably fix) a donor film DF to the frame assembly 1000.

Referring to FIGS. 2 and 3, the clamping unit 600 includes a clamping frame 610 and a clamper 620. The clamping frame 610 is attached to the connection frame 220 and longitudinally extends in the second direction D2. In this manner, the clamping frame 610 is configured to support the clamper 620. A first opening may be provided in a bottom of the clamping frame 610. The first opening may longitudinally extend in the second direction D2 and may be configured to allow the donor film DF to be inserted into an interior cavity region of the clamping frame 600. A second opening may be provided in a top of the clamping frame 610 to allow the clamper 620 to be exposed. In exemplary embodiments, the clamper 620 is configured to clamp (or otherwise detachably couple) the donor film DF to the frame assembly 1000, and, thereby, enable the donor film DF to be primarily stretched using the frame assembly 1000. The clamper 620 may be any suitable geometric shape, e.g., a bar shape, and may wind the donor film DF to be stretched around a wrapping axis of the clamper 620 extending in the third direction D3. Although not shown, the clamper 620 may additionally and/or alternatively include one or more other detachable coupling mechanism, such as a pair of tongs.

Figure 5:
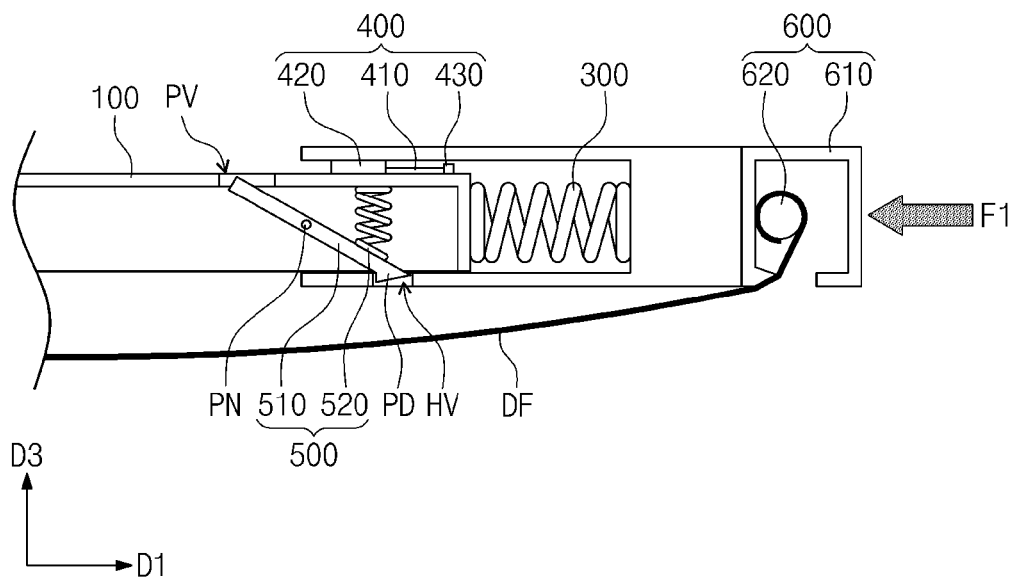
FIG. 5 is a partial side view of the frame assembly in a compressed state, according to exemplary embodiments.
Figure 6:
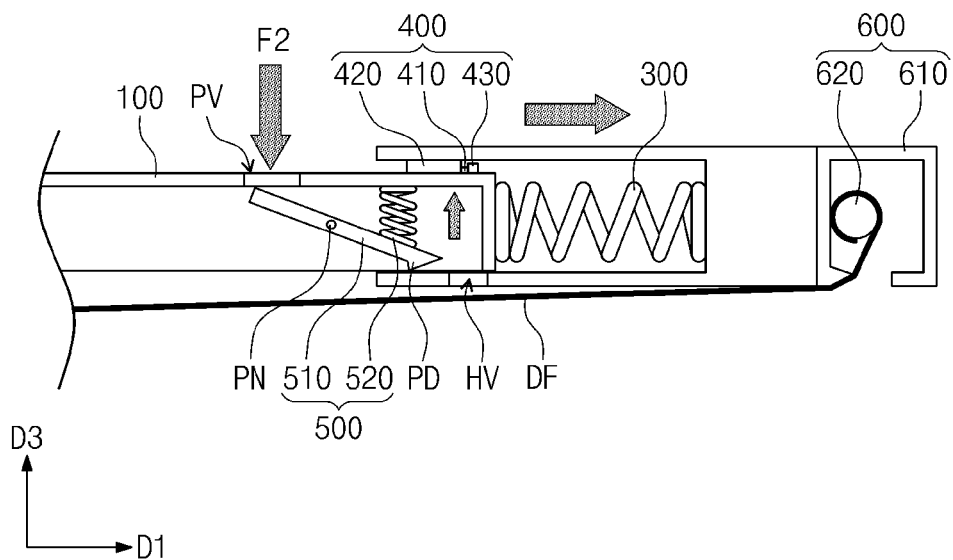
FIG. 6 is a partial side view of the frame assembly in a tensioned (or otherwise stretched) state, according to exemplary embodiments.

Operation of the frame assembly 1000 is described in more detail in association with FIGS. 5 and 6. FIG. 5 is a side view of the frame assembly 1000 in a compressed state, according to exemplary embodiments. FIG. 6 is a side view of the frame assembly 1000 in a tensioned (or otherwise stretched) state, according to exemplary embodiments.

Referring to FIG. 5, when a compression force F1 is applied to the frame assembly 1000 in the first direction D1, the frame assembly 1000 may transition to a compressed state. When the compression force F1 is applied to the frame assembly 1000, the extension spring 300 is compressed and the extension frame 200 is translated in a direction in which the compression force F1 is applied, e.g., in the first direction D1. When the protrusion PD of the hook 510 is locked into the locking groove HV while the extension frame 200 is being transferred, although the compression force F1 is not applied any more, the extension spring 300 is configured to maintain the compressed state. In exemplary embodiments, when the frame assembly 1000 is in the compressed state, the clamping unit 600 may stretch the donor film DF.

Referring to FIG. 6, when the protrusion PD of the hook 510 is unlocked from the locking groove HV, the frame assembly 1000 transitions into a tensile state. That is, when a pushing force F2 is applied to another end of the hook 510 via the pushing groove PV, the hook 510 rotates about the fastening pin in the third direction D3, and the protrusion PD is unlocked from the locking groove HV. In this manner, rotation of the hook 510 enables the inner spring 520 to be compressed. Compression of the inner spring 520 enables the protrusion PD to be unlocked from the locking groove HV.

When the protrusion PD is unlocked from the locking groove HV, the extension spring 300 is restored to an uncompressed position by a stored elastic force and the extension frame 200 is translated in the first direction D1 away from a central region of the frame assembly 1000. In this manner, the donor film DF is stretched by the translation of the extension frame 200 since the donor film DF is detachably coupled to the clamping unit 600.

According to exemplary embodiments, the donor film DF is fastened to the frame assembly 1000 while being stretched by the clamping unit 600. Before being laminated on an acceptor substrate (not shown), at least one intermediate process, for example, a process of thermally drying and a process of depositing an organic material onto the donor film DF may be performed. The process of thermally drying the donor film DF is a process for removing moisture and a solvent contained in the donor film DF because the organic material may be vulnerable to moisture and the solvent. The process of depositing the organic material onto the donor film DF may be any suitable formation process, such as, for example, a vacuum deposition process using a deposition source.

When heat is applied to the donor film DF during the intermediate process, the donor film DF may be locally expanded, and, thereby, may droop or may be wrinkled regardless of the primary stretch imposed by the clamping unit 600. A wrinkled donor film DF may not be evenly laminated on the acceptor substrate, and, as such, may cause defects, such as wrinkles and stains on an organic thin film to be transferred.

According to exemplary embodiments, however, the frame assembly 1000 performs a secondary stretch by enabling the extension frame 200 to be further translated in the first direction D1 after the intermediate process. As such, although the donor film DF may droop or become wrinkled in association with the intermediate process, since the donor film DF may maintain a tensile state via the secondary stretch, the donor film DF may be evenly laminated on the acceptor substrate. Once the intermediate processing is complete (or as part of the intermediate process(es)), the donor film DF may be laminated on the acceptor substrate. An organic material layer formed on the donor film DF is transferred onto the acceptor substrate by, for example, scanning a laser onto a certain area of the donor film DF, which forms an organic film pattern.

According to exemplary embodiments, the frame assembly 1000 for a donor film DF, and the method of manufacturing an organic light emitting display using the frame assembly 1000, enables the donor film DF to be additionally stretched, and, thereby, prevent the occurrence of droops and/or wrinkles, which may cause defects.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A frame assembly for a donor film, comprising: a main frame extending in a first direction; an extension frame comprising a cavity region, extending into the extension frame and configured to receive at least a portion of the main frame, the extension frame being coupled to at least one side of the main frame and moveable in the first direction relative to the main frame; and a clamping unit configured to detachably couple the donor film to the frame assembly, the extension frame being disposed between the at least one side of the main frame and the clamping unit.

2. The frame assembly of claim 1, further comprising:
an extension spring disposed between the main frame and the extension frame, wherein translation of the extension frame in the first direction relative to the main frame compresses or stretches the extension spring.

3. The frame assembly of claim 2, wherein the extension spring biases the frame assembly toward a tensioned state of the donor film.

4. The frame assembly of claim 2, wherein the extension spring is disposed between an outer side surface of the main frame and an inner side surface of the cavity region of the extension frame facing the outer side surface of the main frame.

5. The frame assembly of claim 2, wherein:
the extension frame comprises:
a coupling frame extending in the first direction, the coupling frame comprising the cavity region; and
a connection frame extending in a second direction substantially perpendicular to the first direction, the connection frame being connected to the coupling frame; and
the cavity region longitudinally extends toward a connection point at which the coupling frame is connected to the connection frame.

6. The frame assembly of claim 5, further comprising:
a linear coupling unit configured to guide the translation of the extension frame in the first direction relative to the main frame; and
a locking unit at least partially disposed in the main frame, the locking unit being configured to selectively maintain the frame assembly in a compressed state,
wherein, in the compressed state, the extension spring is compressed between the main frame and the clamping unit.

7. The frame assembly of claim 6, wherein the linear coupling unit comprises:

a linear motion guide disposed on a surface of the main frame bent from the at least one side of the main frame, the linear motion guide longitudinally extending in the first direction;
a linear motion block coupled to an inner surface of the cavity region, the linear motion block being slideably engaged with the linear motion guide; and
a stopper disposed on the linear motion guide to prevent separation of the linear motion block from the linear motion guide.

8. The frame assembly of claim 6, wherein the locking unit comprises:
a hook rotateably coupled to the main frame, the hook comprising a protrusion formed on an end portion; and
an inner spring disposed between the hook and an inner surface of the main frame.

9. The frame assembly of claim 8, wherein:
the coupling frame comprises a locking groove formed in an inner surface of the cavity region; and
rotation of the hook enables the protrusion to selectively engage the locking groove.

10. The frame assembly of claim 9, wherein:
in a compressed state of the frame assembly, the protrusion is engaged with the locking groove and the extension spring is maintained in a compressed state; and
in a tensioned state of the frame assembly, the protrusion is not engaged with the locking groove and a biasing force of the extension spring translates the extension frame in the first direction relative to the main frame to stretch the donor film.

11. The frame assembly of claim 8, wherein:
the inner surface of the main frame further comprises a pushing groove configured to expose another end of the hook in a compressed state of the frame assembly.

* * * * *